United States Patent
Huo et al.

(10) Patent No.: US 8,643,520 B1
(45) Date of Patent: Feb. 4, 2014

(54) DIGITAL-TO-ANALOG CONVERTER (DAC) CURRENT CELL WITH SHADOW DIFFERENTIAL TRANSISTORS FOR OUTPUT IMPEDANCE COMPENSATION

(71) Applicants: Xiao Huo, Hong Kong (HK); Beiping Yan, Hong Kong (HK); Zhongzi Chen, Hong Kong (HK); Xiaowu Cai, Shenzhen (CN)

(72) Inventors: Xiao Huo, Hong Kong (HK); Beiping Yan, Hong Kong (HK); Zhongzi Chen, Hong Kong (HK); Xiaowu Cai, Shenzhen (CN)

(73) Assignee: Hong Kong Applied Science & Technology Research Institute Company Ltd., Hong Kong (HK)

( * ) Notice: Subject to any disclaimer, the term of this patent is extended or adjusted under 35 U.S.C. 154(b) by 0 days.

(21) Appl. No.: 13/685,883

(22) Filed: Nov. 27, 2012

(51) Int. Cl.
*H03M 1/00* (2006.01)

(52) U.S. Cl.
USPC .......................................... 341/136; 341/144

(58) Field of Classification Search
USPC .................................. 341/136, 144
See application file for complete search history.

(56) References Cited

U.S. PATENT DOCUMENTS

| | | | |
|---|---|---|---|
| 5,254,994 A | 10/1993 | Takakura et al. | |
| 5,612,696 A * | 3/1997 | Kim | 341/136 |
| 5,933,107 A * | 8/1999 | Tan | 341/144 |
| 6,842,132 B2 | 1/2005 | Schafferer | |
| 7,619,552 B1 | 11/2009 | Schofield | |
| 2012/0032829 A1 | 2/2012 | Kier et al. | |

OTHER PUBLICATIONS

Van den Bosch, Anne, et al., "A 10-bit 1-GSample/s Nyquist Current-Steering CMOS D/A Converter", JSSC vol. 36 No. 3, Mar. 2001, pp. 315-324.
Miki, Takahiro, et al., "An 80-MHz 8-bit CMOS D/A Converter", JSSC vol. SC-21 No. 6, Dec. 1986, pp. 983-988.
Chi-Hung Lin, et a;., "A 12 bit 2.9 GS/s DAC With IM3 < -60 dBc Beyond 1 GHz in 65 nm CMOS", JSSC vol. 44 No. 12, Dec. 2009, pp. 3285-3293.

* cited by examiner

*Primary Examiner* — Khai M Nguyen
(74) *Attorney, Agent, or Firm* — Stuart T. Auvinen; gPatent LLC

(57) ABSTRACT

An equalized-impedance shadowed current cell can be arrayed in a Digital-to-Analog Converter (DAC) or other converters or applications. The Equalized-impedance shadowed current cell has primary differential transistors in parallel with shadow differential transistors that have gates driven inversely to gates of the primary differential transistors. A shadow current from the shadow differential transistors is much smaller than a primary current switched by the primary differential transistors. Cell current is not switched off to zero but to the shadow current. The ON state and OFF state impedances of the current cell may be matched during circuit design so that the impedance is the same regardless of digital input values. The Width and Length of the shadow differential transistors are adjusted so that overall output impedances for the ON and OFF states of the current cell are matched. Since output impedance is input code independent, high-speed performance is improved.

20 Claims, 7 Drawing Sheets

DIGITAL-TO-ANALOG CONVERTER (DAC) CURRENT CELL WITH SHADOW DIFFERENTIAL TRANSISTORS FOR OUTPUT IMPEDANCE COMPENSATION

FIELD OF THE INVENTION

This invention relates to current-cell Digital-to-Analog Converters (DACs), and more particularly to current cells with impedances that are not dependent on the digital code.

BACKGROUND OF THE INVENTION

Many applications use converters such as Digital-to-Analog Converters (DACs). High-speeds and high resolutions are needed for DACs used in applications such as for industrial, medical, automotive, and consumer areas.

Current-cell DACs have many current cells that turn currents on or off by a digital code. The currents are summed to create a combined analog current that is the analog representation of the digital code. The combined analog current may be converted to an analog voltage by passing the current through a resistor.

A thermometer-code DAC has a total of $2^N-1$ current cells that each produce a same current. A binary-weighted DAC has current cells with currents that double for each successive current cell. A hybrid DAC has some binary-weighted current cells, such as for most-significant-bits (MSBs), and some equal-current cells, such as for least-significant-bits (LSBs).

FIG. 1 shows a current-cell DAC. Current sources 31, 32, 33, ... 35, 36 all have equal currents of $I_0$. A digital input is converted to a thermometer code S1, S2, S3, ... S($2^N-2$), S($2^N-1$) to control switches 21, 22, 23, ... 25, 26. Each switch causes the entire cell current $I_0$ to switch either to true output OUT+ or to complement output OUT−. Resistors 10, 12 between an analog power supply voltage AVDD and OUT−, OUT+ produce analog voltages that are converted from the digital value represented by the thermometer code.

FIG. 2 is a graph of the spectral performance of a DAC. The signal strength of the output of the DAC is highest at a fundamental frequency F0. The signal strength is lower for other frequencies of operation, but is higher at spur frequency F1. The difference in signal strength between fundamental 14 and spur 16 is the Spur-Free Dynamic Range (SFDR). A larger SFDR is important for better high-speed performance of a DAC.

Larger spurs often occur at harmonics of the fundamental frequency, especially the second and third order harmonics. A higher output impedance of the current cells can improve the SFDR.

The inventors have realized that the output impedance varies with the digital code being converted. The code-dependent output impedance is a cause of harmonic distortion that increases the signal strength of spurs and thus decreases the SFDR and reduces high-speed performance of DACs.

What is desired is a DAC that has an improved high-speed performance. A DAC with a high output impedance that does not vary with the digital code is desired. A DAC with reduced spurs at harmonics is desirable. A DAC is desired to be constructed from current cells that have a constant output impedance, regardless of the digital code being converted.

DETAILED DESCRIPTION

The present invention relates to an improvement in current-cell DACs. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
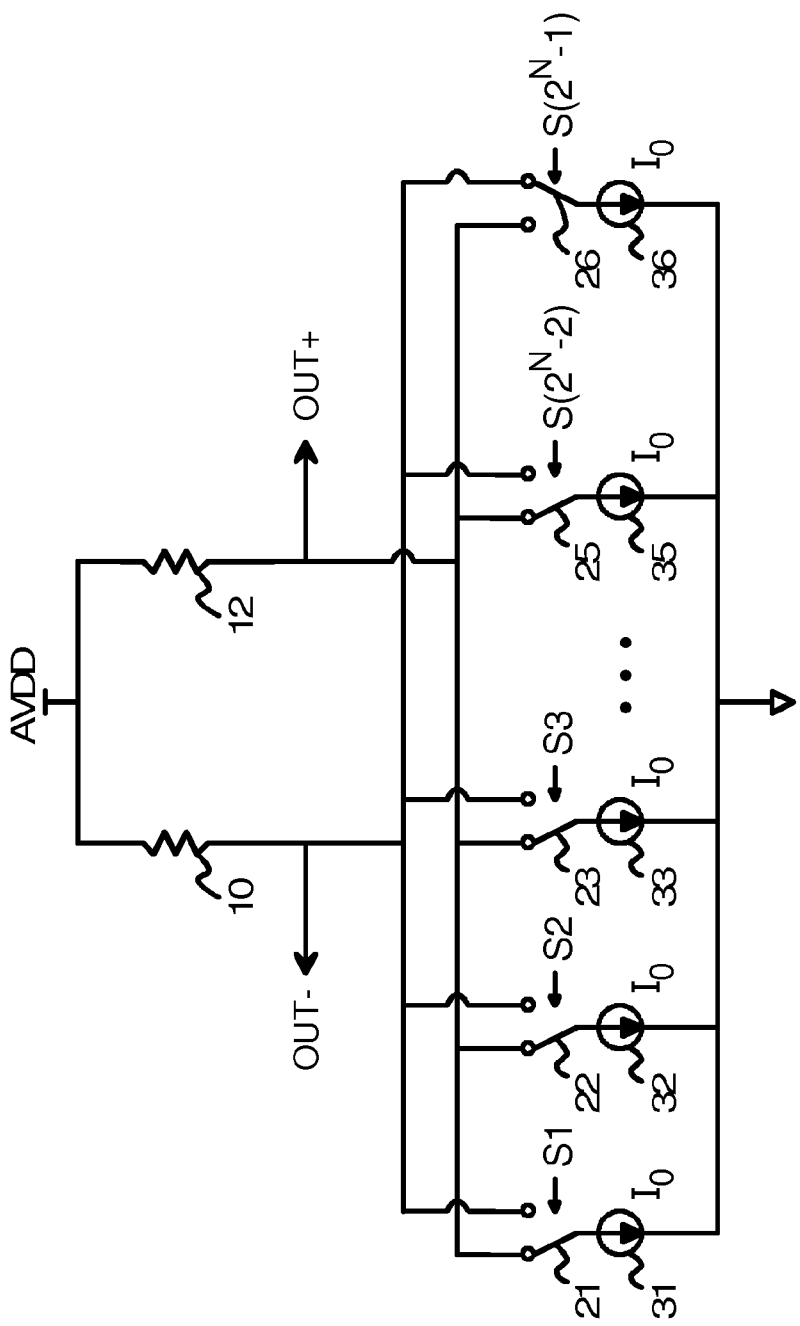
FIG. 1 shows a current-cell DAC.
Figure 2:
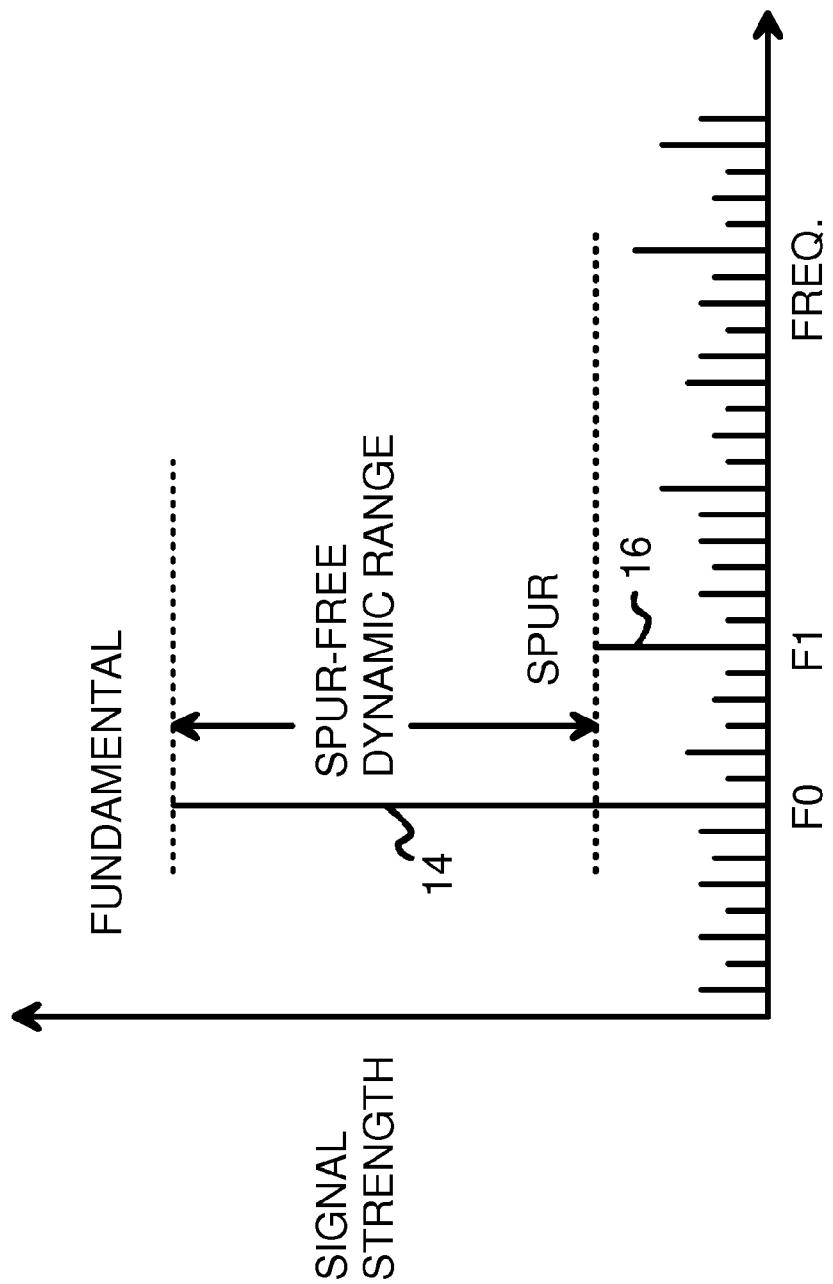
FIG. 2 is a graph of the spectral performance of a DAC.
Figure 3:
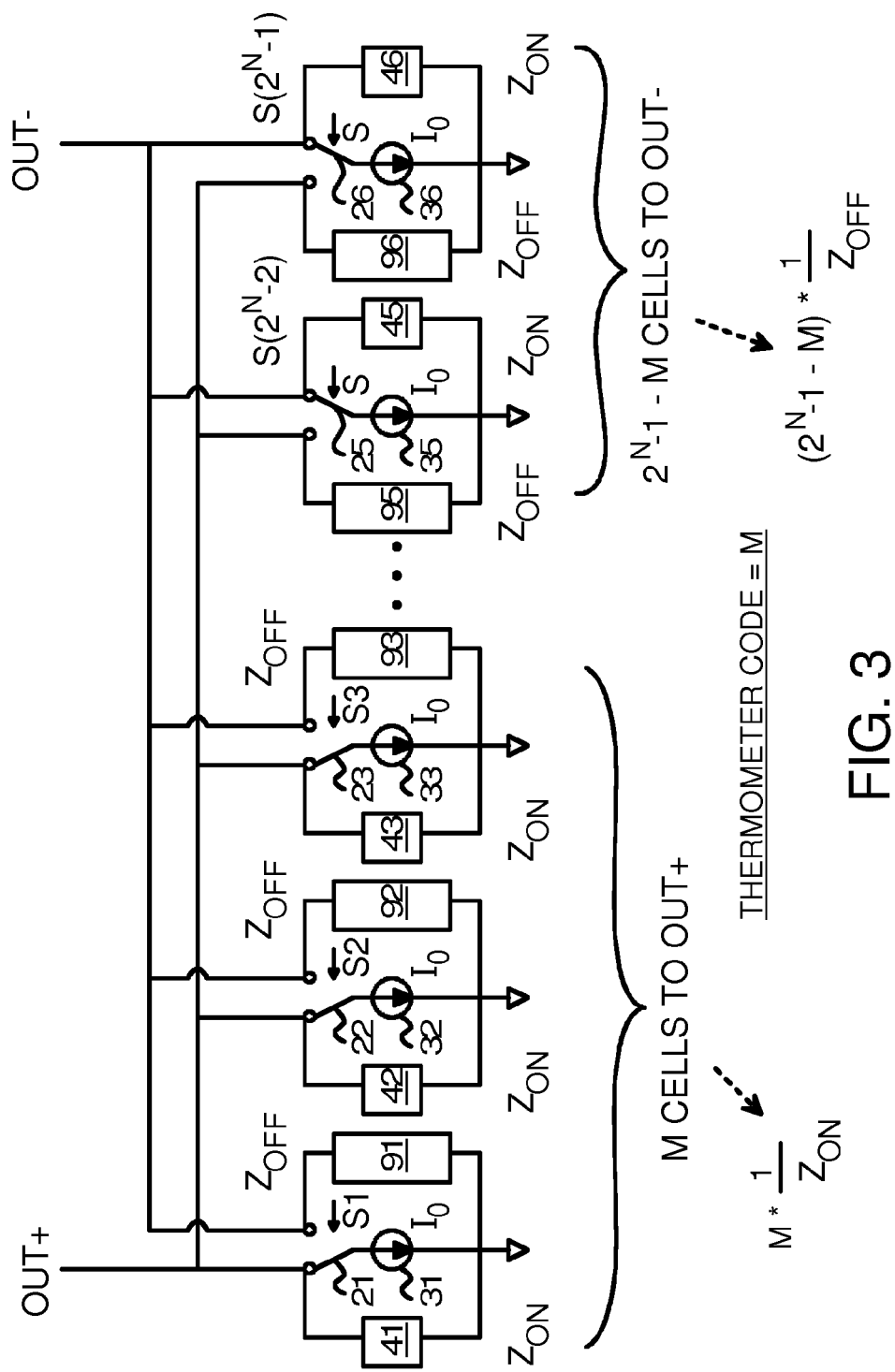
FIG. 3 is an idealized diagram of a current-cell DAC with equalized output impedances.

FIG. 3 is an idealized diagram of a current-cell DAC with equalized output impedances. A digital value is represented as a thermometer code of value M. M can be any value from 0 to $2^N-1$. In this diagram M is being converted to an analog current.

Current sources 31, 32, 33, ... 35, 36 all have equal currents of $I_0$. A digital input is converted to a thermometer code S1, S2, S3, ... S($2^N-2$), S($2^N-1$) to control switches 21, 22, 23, ... 25, 26. Each switch causes the entire cell current $I_0$ to switch either to true output OUT+ or to complement output OUT−. Resistors (not shown) may be added between an analog power supply voltage AVDD and OUT−, OUT+ produce analog voltages that are converted from the digital value represented by the thermometer code M.

The total current switched to true output OUT+ is $M*I_0$. The total current switched to complement output OUT− is $(2^N-1-M)*I_0$.

Each current cell can be modeled as having two impedances, an ON impedance and an OFF impedance. The ON impedance is much lower than the OFF impedance. When a current cell is switched on, its ON impedance is in parallel with its current source. The current source may be implemented as a transistor that is turned on, and thus has a low channel resistance and high current.

When a current cell is switched off, its OFF impedance is connected top the switch's output. The current cell may be implemented as a transistor that is turned off, and thus has a very high channel resistance and low current.

In a thermometer-code DAC of $2^N-1$ current cells that is converting the digital thermometer value M, there are M current cells that are switched ON. The remaining $2^N-1-M$ current cells are switched OFF.

The M current cells that are switched ON have their current sources 31, 32, 33, ... switched to output OUT+ by switches 21, 22, 23, ... since S1, S2, S3, ... are high. OUT+ is also connected to ON impedances 41, 42, 43, ... by switches 21, 22, 23 .... In these M current cells, complement output OUT− is disconnected from the cell current by switches 21, 22, 23, ..., but OUT− is still connected to the larger OFF impedances 91, 92, 93 ....

The remaining $2^N-1-M$ current cells that are switched OFF have their current sources . . . 35, 36, switched to complement output OUT− by switches . . . 25, 26, since thermometer code bits . . . S($2^N-2$), S$2^N-1$, are low. OUT− is also connected to ON impedances . . . 45, 46 by switches . . . 25, 26. In these $2^N-1-M$ current cells, true output OUT+ is disconnected from the cell current by switches . . . 25, 26, but OUT+ is still connected to OFF impedances . . . 95, 96.

Looking at true output OUT+, it connects to M ON impedances 41, 42, 43, . . . and to $2^N-1-M$ OFF impedances . . . 95, 96. The reciprocal of the total output impedance Z+ of line OUT+ is:

$$1/Z+ = M*(1/Zon) + (2^N-1-M)*(1/Zoff)$$

where Zon is the ON impedance of each current cell, and Zoff is the OFF impedance of each current cell, and M is the number of cells turned ON by the thermometer code.

For the complement output OUT−, it connects to M OFF impedances 91, 92, 93, . . . and to $2^N-1-M$ ON impedances . . . 45, 46. The reciprocal of the total output impedance Z− of line OUT− is:

$$1/Z- = M*(1/Zoff) + (2^N-1-M)*(1/Zon)$$

The inventors have realized that although the OFF impedance is typically much higher than the ON impedance for a simple current cell transistor, shadow current cell transistors may be added to adjust impedances. Rather than completely switch off all current, a small OFF current may be tolerated and accounted for. Having a small OFF current allows for the output impedances to be adjusted.

In particular, shadow transistors may be added to a current cell to allow the overall ON and OFF impedances of a current cell to be equalized. When the ON and OFF impedance of each current cell are equal, then there is no code-dependent variation of the output impedance, since the cell's impedance is the same whether the cell is ON or OFF. When the cell's impedance no longer varies with the digital input values, then the harmonic distortions due to spurs may be reduced, providing better high-speed performance and SFDR.

Figure 4:
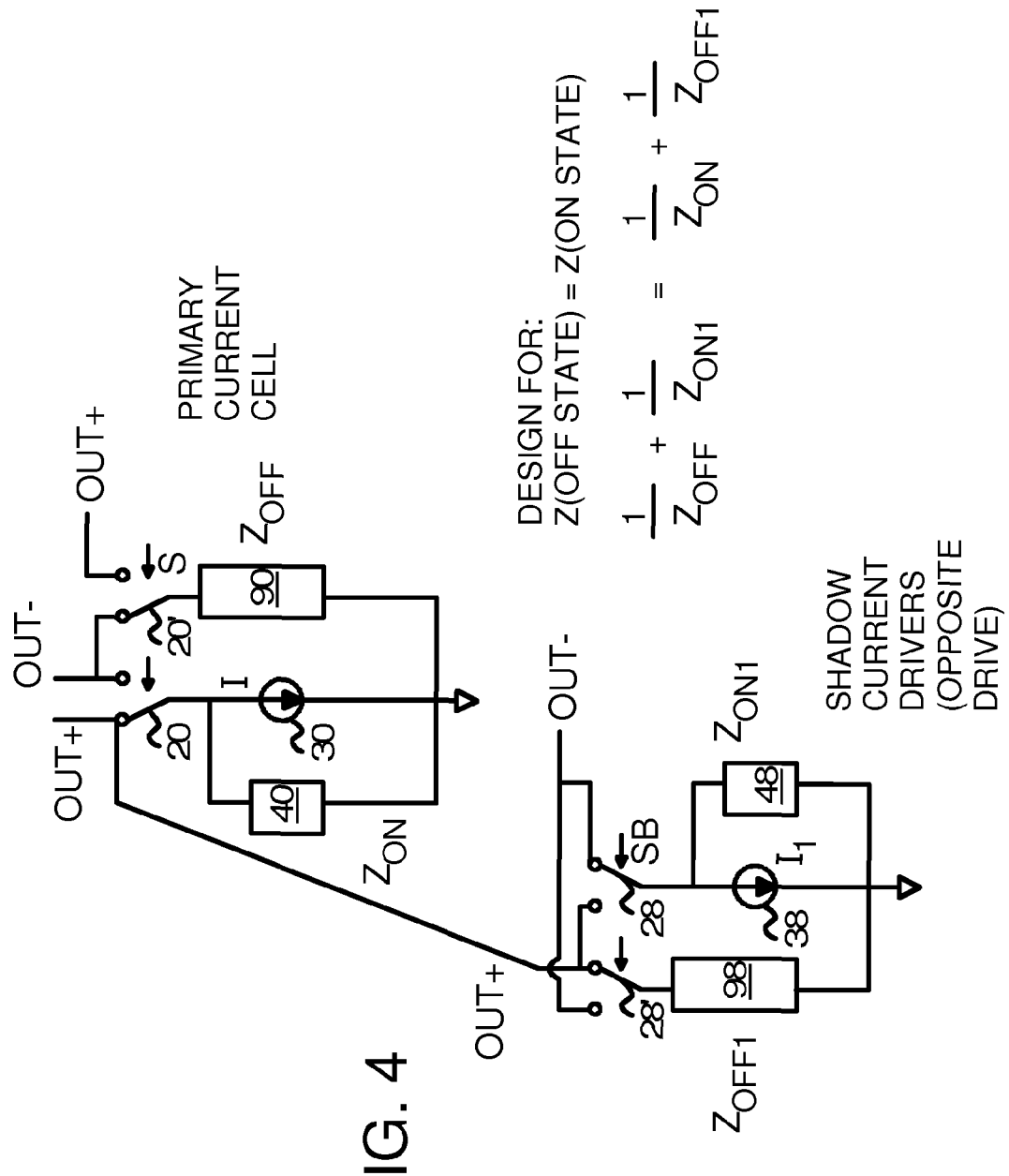
FIG. 4 shows a current cell with a shadow current drivers that allow the output impedances to be equalized for the ON and OFF states.

FIG. 4 shows a current cell with a shadow current drivers that allow the output impedances to be equalized for the ON and OFF states. Each current cell includes primary cell drivers and shadow drivers.

The primary cell drivers are modeled by current source 30, which is switched between output lines OUT+, OUT− by switch 20 in response to a bit S in the thermometer code. The shadow drivers are modeled by current source 38, which is switched between output lines OUT+, OUT− by switch 28 in response to the inverse SB of bit S in the thermometer code. Primary current source 30 switches a larger current I while shadow current source 38 switches a much smaller current $I_1$.

Since primary current source 30 is switched by S, while shadow current source 38 is switched by SB, primary current I and shadow current $I_1$ are switched to opposite outputs. For example, when S=1 and SB=0, primary current I is switched to OUT+ and secondary current $I_1$ is switched to OUT−. When S=0 and SB=1, primary current I is switched to OUT− and secondary current $I_1$ is switched to OUT+. Thus there is always some current switched to each output. In the OFF state, OUT+ still receives shadow current $I_1$, rather than zero current.

In the primary cell, ON impedance 40 is always in parallel with primary current source 30. Both ON impedance 40 and primary current source 30 are connected to OUT+ (or OUT−) by switch 20. OFF impedance 90 is switched to the other output OUT− (or OUT+) by switch 20'. Both switches 20, 20' respond to bit S.

For the shadow drivers, ON1 impedance 48 is always in parallel with shadow current source 38. Both ON1 impedance 48 and shadow current source 38 are connected to OUT− (or OUT+) by switch 28. OFF1 impedance 98 is switched to the other output OUT+ (or OUT−) by switch 28'. Both switches 28, 28' respond to SB, the inverse of bit S. Note that switches 20, 20' make the opposite connection (to the opposite of OUT+ or OUT−) than switches 28, 28'.

Thus when S=1, in the primary cell, switch 20 connects OUT+ to current I and to ON impedance 40, ZON, and switch 20' connects OFF impedance 90, ZOFF, to OUT−. For the shadow drivers, switch 28' connects OFF1 impedance 98, ZOFF1, to OUT+. and switch 28 connects OUT− to current $I_1$ and to ON1 impedance 48, ZON1.

On and Off Impedances Matched by Design

Thus for S=1, the ON state, OUT+ receives primary current I and impedances ZON and ZOFF1. OUT− receives shadow current $I_1$ and impedances ZOFF and ZON1.

For S=0, the OFF state, OUT+ receives shadow current $I_1$ and impedances ZOFF and ZON1. OUT− receives primary current I and impedances ZON and ZOFF1.

Since each output receives two impedances in parallel, the overall output impedance added to output OUT+ of a current cell during the ON state is:

$$1/Z(ON) = 1/ZON + 1/ZOFF1$$

The overall output impedance added to output OUT+ of a current cell during the OFF state is:

$$1/Z(OFF) = 1/ZOFF + 1/ZON1$$

The inventors realize that these four impedances, ZON, ZOFF, ZON1, ZOFF1, may be adjusted by design, such as by changing the channel width W, channel length L, and the source, gate, and drain voltages for transistors that are modeled by the current sources and impedances, or by using another transistor type, such as using Bipolar transistors for the shadow transistors and a MOS transistor for the primary transistors.

Code-dependence of the output impedances may be eliminated by designing the current cell to have the ON state impedance match the OFF state impedance. If that design goal is met, then the output impedance of a current cell is the same, regardless of the digital code bit (S, SB) applied to that current cell.

Figure 5:
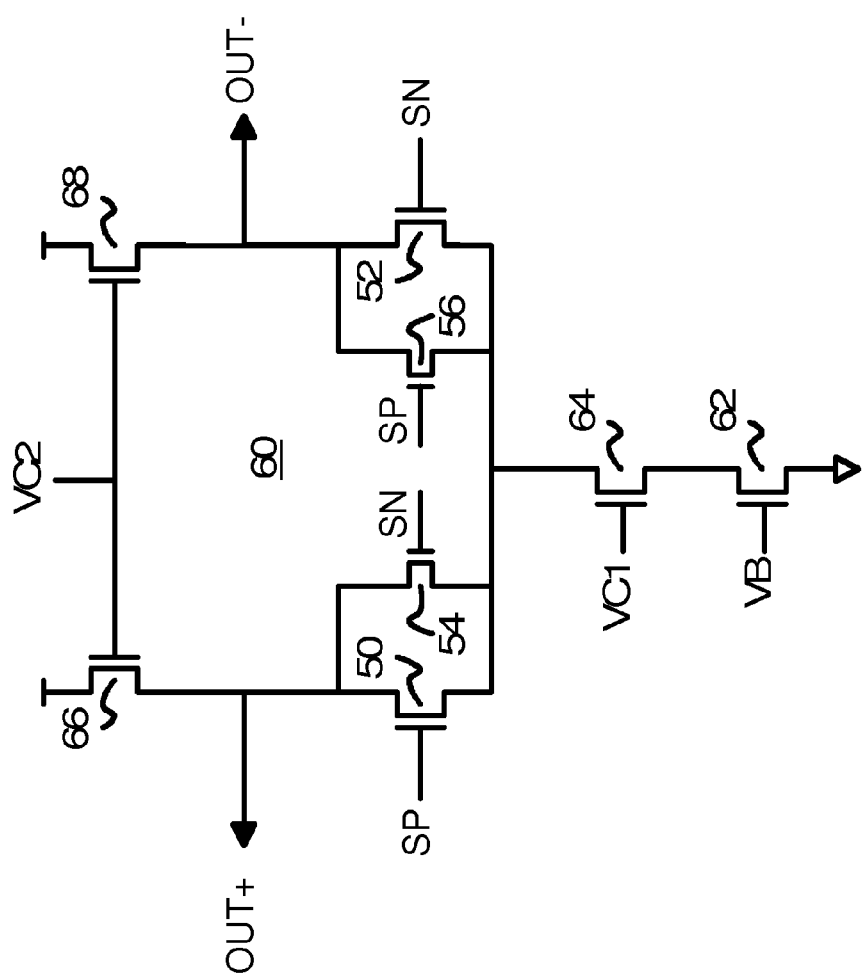
FIG. 5 is an NMOS implementation of an equalized-impedance shadowed current cell for a DAC.

FIG. 5 is an NMOS implementation of an equalized-impedance shadowed current cell for a DAC. Transistors 50, 52, 54, 56, 62, 64, 66, 68 are all n-channel transistors in this embodiment of equalized-impedance shadowed current cell 60.

A bit S of the thermometer code is applied to the gates of primary differential transistors 50, 52, with positive signal SP being applied to the gate of primary differential transistor 50 and negative or inverse signal SN being applied to the gate of primary differential transistor 52. Signals SP, SN could be a differential signal. Tail current is steered between primary differential transistors 50, 52. The tail current is generated by cascode transistor 64 in series with tail transistor 62.

Load transistor 66 drives current to output OUT+, while load transistor 68 drives current to output OUT−. Bias voltage VC2 is applied to the gates of load transistors 66, 68. Bias voltage VB is applied to the gate of tail transistor 62 and cascode bias voltage VC1 is applied to the gate of cascode transistor 64.

Equalized-impedance shadowed current cell 60 has primary differential transistors 50, 52 that are much larger than shadow differential transistors 54, 56. Thus primary current I is much larger than shadow current $I_1$. For example, shadow current $I_1$ may be only 1/10 or 1/20 the size of primary current I.

Shadow differential transistor 54 is in parallel with primary differential transistor 50 between the tail node and OUT+, but receives the opposite gate signal (SN rather than SP). Likewise, shadow differential transistor 56 is in parallel with primary differential transistor 52 between the tail node and OUT−, but receives the opposite gate signal (SP rather than SN). Shadow differential transistors 54, 56 create an opposite but much smaller switched shadow current $I_1$ than primary differential transistors 50, 52.

Although this opposite shadow current is much smaller than the primary switched current of primary differential transistors 50, 52, the impedances of shadow differential transistors 54, 56 tend to be larger due to their smaller current drive. The larger contribution of impedances from shadow differential transistors 54, 56 allows the ON and OFF state impedances to be more easily matched.

The W and L values of primary differential transistors 50, 52 may also be adjusted to change the output impedance of primary differential transistors 50, 52 when on (ZON) and off (ZOFF). Likewise, the W and L values of shadow differential transistors 54, 56 may also be adjusted to change the output impedance of shadow differential transistors 54, 56 when on (ZON1) and off (ZOFF1).

Further adjustments to ON and OFF impedances may be obtained by adjusting operating voltages. The source voltages of transistors 50, 52, 54, 56 may be adjusted up or down by adjusting bias voltages VB, VC1 and the sizes of transistors 62, 64. The gate voltages may be adjusted by shifting the input voltages SP, SN to the gates. The drain voltages may be adjusted by changing bias voltage VC2 and the sizes of load transistors 66, 68. Additional transistors (not shown) in series with the channels of shadow differential transistors 54, 56 may be added to increase ZON1, ZOFF.

Figure 6:
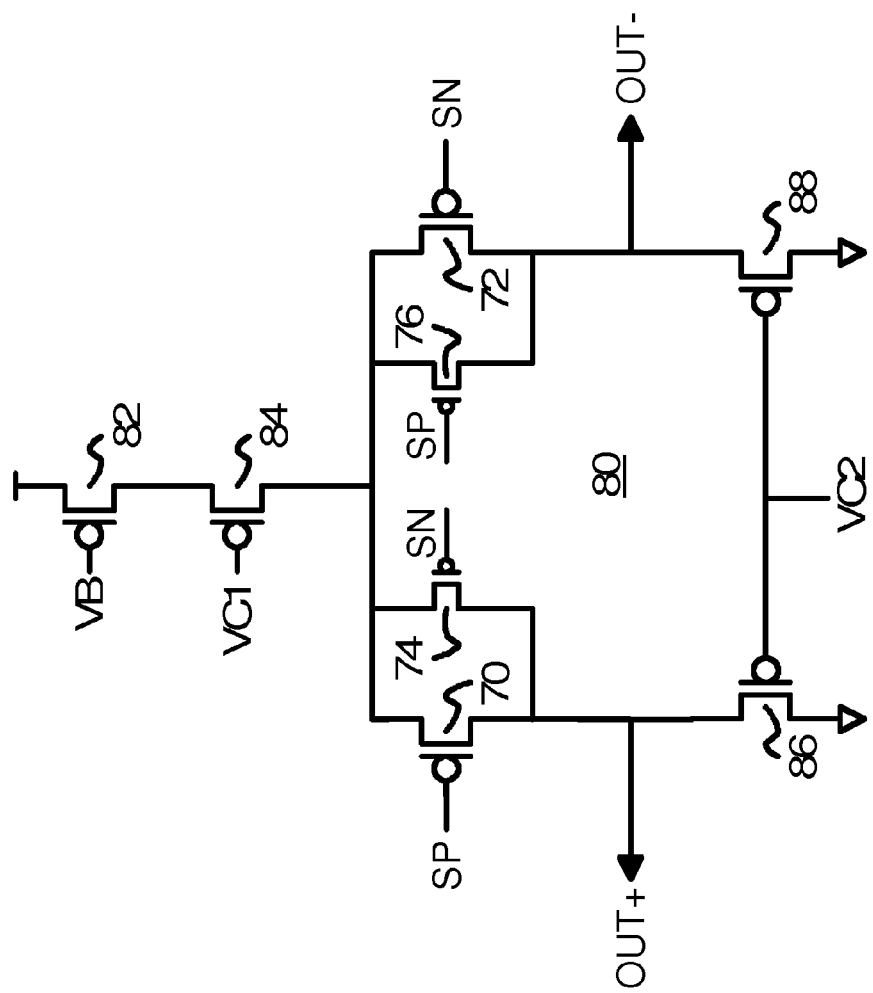
FIG. 6 is a PMOS implementation of an equalized-impedance shadowed current cell for a DAC.

FIG. 6 is a PMOS implementation of an equalized-impedance shadowed current cell for a DAC. Transistors 70, 72, 74, 76, 82, 84, 86, 88 are all p-channel transistors in this embodiment of 80 in this embodiment of equalized-impedance shadowed current cell 60. Primary differential transistors 70, 72 are larger in size and lower in impedance than shadow differential transistors 74, 76.

Figure 7:
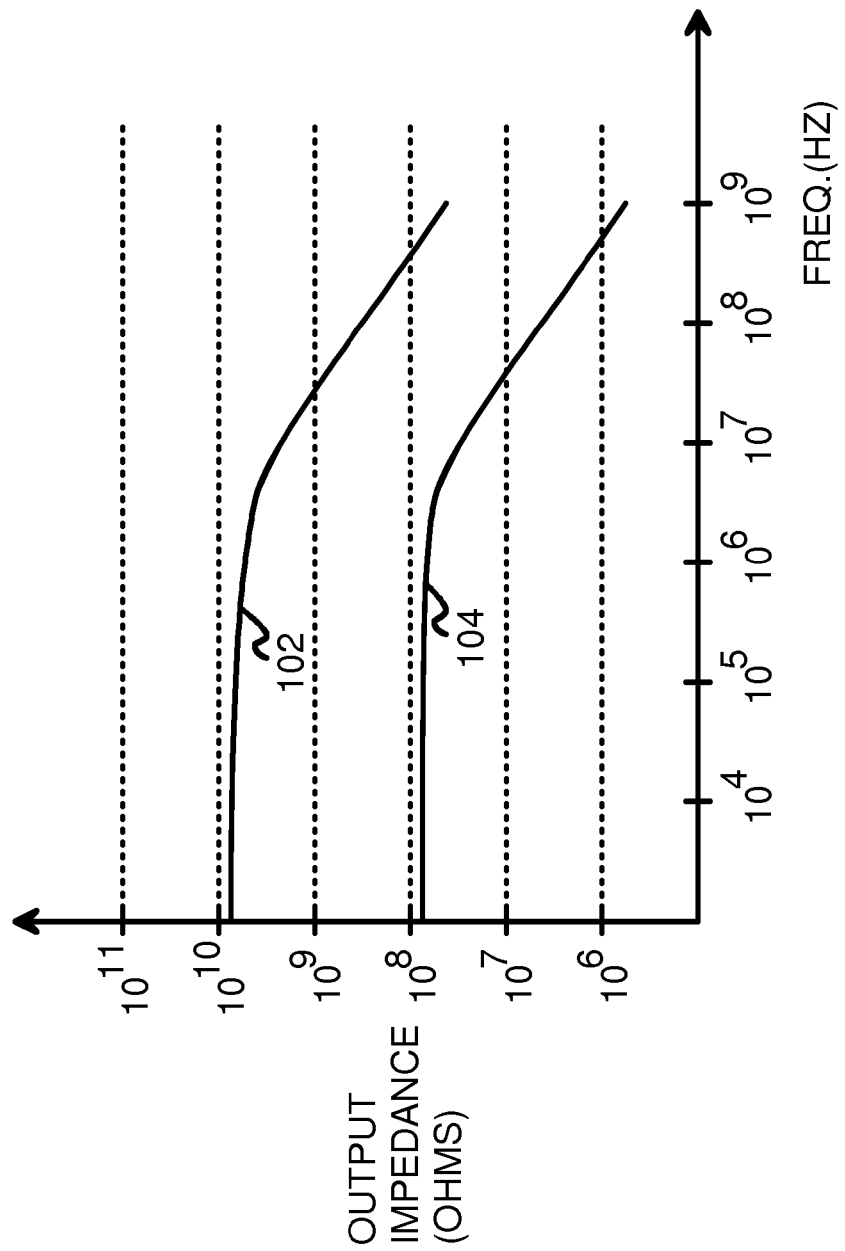
FIG. 7 is a plot of output impedance as a function of frequency for a standard current cell and for an equalized-impedance shadowed current cell.

FIG. 7 is a plot of output impedance as a function of frequency for a standard current cell and for an equalized-impedance shadowed current cell. Curve 104 shows that the output impedance for a standard current cell has a lower impedance over a range of frequencies. Curve 102 shows that output impedances are larger for the equalized-impedance shadowed current cell. Curve 102 is the effective output impedance of a single cell for all values of digital code M.

Also, simulations show that the SFDR is improved by more than 2 dB using the equalized-impedance shadowed current cell compared with a standard current cell. Thus performance is improved.

Alternate Embodiments

Several other embodiments are contemplated by the inventors. While a thermometer code has been described, the DAC could be a hybrid DAC with a thermometer code for only the LSBs, and with binary-weighted current cells for MSBs. The DAC could also have only binary-weighted current cells. While an application in a DAC has been described, the circuit may be used for other applications and systems.

While a design goal of matching the ON and OFF state impedances has been described, code dependence may be reduced and performance improved if the difference between the ON and OFF state impedances are reduced. The ON and OFF state impedances do not have to be absolutely equal, but could match within 20% and still improve performance. Thus the ON and OFF state impedances may be considered to be equalized when they are within 5%, 10%, or 20% or each other.

FIG. 3 is a simplified diagram. The switching of ON and OFF impedances in FIG. 3 is more complex, such as shown for switches 20, 20' in FIG. 4 for one cell. FIG. 3 shows switches and impedances for one snapshot of time.

While FIG. 5 has shown an all-NMOS implementation, load transistors 66, 68 could be p-channel transistors, depletion transistors, or some other kind of transistor. Load transistors 66, 68 could also be replaced by passive resistor loads. Likewise in FIG. 6 load transistors 86, 88 could be n-channel transistors or some other kind of transistor. Primary differential transistors 50, 52 are typically matched in size and thus have the same size. Shadow differential transistors 54, 56 are also typically matched. Sometimes transistors may be matched in orientation, geometry, and layout as well as the W/L size.

The number of bits N in a DAC array may be adjusted. A single-ended array with a single output OUT+ may be used rather than a differential array with OUT+, OUT−. Both differential and single-ended analog current may be generated. A single-ended analog voltage may be generated on one differential output, while a reference voltage is other differential output. Power-down or other control circuits may be added.

The thermometer bits S from can be merged with other control or timing information, such as from control logic or a sequencer, or a multi-phase non-overlapping clock, or a power-down signal.

Some embodiments may not use all components. For example, switches may be added or deleted in some embodiments. Different kinds of switches may be used, such as 2-way switches or 3-way switches. Muxes may be used as switches. Input or output resistors could be added, or more complex input filters used. Multiple levels of switches may be used, such as 2-way switches for switches, and then an overall switch that connects either VDD or GND to these 2-way switches.

Inversions may be added by swapping inverting and non-inverting inputs or outputs as desired, but do not change the overall function and thus may be considered equivalents.

While positive currents have been described, currents may be negative or positive, as electrons or holes may be considered the carrier in some cases. Source and sink currents may be interchangeable terms when referring to carriers of opposite polarity. Currents may flow in the reverse direction. A fixed bias voltage may be switched to power or ground to power down the circuit. The terms source and drain may be interchangeable, depending on bias conditions. Bulk or substrate connections may connect to ground, power supplies, intermediate fixed voltages, or to circuit nodes.

While Complementary-Metal-Oxide-Semiconductor (CMOS) transistors have been described, other transistor technologies and variations may be substituted, and materials other than silicon may be used, such as Galium-Arsinide (GaAs) and other variations.

Capacitors, resistors, and other filter elements may be added. Switches could be n-channel transistors, p-channel transistors, or transmission gates with parallel n-channel and p-channel transistors, or more complex circuits, either passive or active, amplifying or non-amplifying.

Additional components may be added at various nodes, such as resistors, capacitors, inductors, transistors, extra buffering, etc., and parasitic components may also be present. Enabling and disabling the circuit could be accomplished with additional transistors or in other ways. Pass-gate transistors or transmission gates could be added for isolation.

The final sizes of transistors may be selected after circuit simulation or field testing. Metal-mask options or other programmable components may be used to select the final transistor sizes. Transistors may be connected together in parallel to create larger transistors that have the same fringing or perimeter effects across several sizes. Currents may be positive currents or negative currents that flow in an opposite direction.

An equalizing switch could be added between OUT+ and OUT−. Two grounding switches could be used on the true and complement outputs lines. Rather than grounding, some switches could connect to another fixed voltage, such as VDD or VDD/2.

Directional terms such as upper, lower, up, down, top, bottom, etc. are relative and changeable as the system, circuit, or data is rotated, flipped over, etc. These terms are useful for describing the device but are not intended to be absolutes. Signals may be active high or active low, and may be inverted, buffered, encoded, qualified, or otherwise altered. Timings may be adjusted by adding delay lines or by controlling delays. Separate power supplies and grounds may be used for some components.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A shadowed current cell comprising:
a first primary differential transistor having a gate receiving a true input, with a conducting channel between a tail node and a true output node;
a first shadow differential transistor having a gate receiving a complement input, with a conducting channel between the tail node and the true output node;
a second primary differential transistor having a gate receiving the complement input, with a conducting channel between the tail node and a complement output node;
a second shadow differential transistor having a gate receiving the true input, with a conducting channel between the tail node and the complement output node;
a first load device coupled between the true output node and a first supply node;
a second load device coupled between the complement output node and the first supply node;
a cascode transistor having a channel between the tail node and a cascode node; and
a tail transistor having a channel between the cascode node and a second supply node,
wherein during an OFF state when the first primary differential transistor is turned off, the first shadow differential transistor conducts a shadow current to the true output node and contributes a shadow ON impedance to the true output node, and the first primary differential transistor contributes a primary OFF impedance to the true output node;
wherein during an ON state when the first primary differential transistor is turned on, the first primary differential transistor conducts a primary current to the true output node and contributes a primary ON impedance to the true output node, and the first shadow differential transistor contributes a shadow OFF impedance to the true output node,
whereby the shadow OFF impedance is contributed to the true output node during the ON state, and the shadow ON impedance is contributed to the true output node during the OFF state.

2. The shadowed current cell of claim 1 wherein an output impedance of the true output node during the ON state has a value matched to within 20% of a value of the output impedance of the true output node during the OFF state,
whereby output impedances are matched for the ON state and for the OFF state.

3. The shadowed current cell of claim 1 wherein a first sum of a reciprocal of the shadow ON impedance plus a reciprocal of the primary OFF impedance is matched to a second sum of a reciprocal of the shadow OFF impedance plus a reciprocal of the primary ON impedance,
whereby ON and OFF state impedances are matched in the shadowed current cell.

4. The shadowed current cell of claim 3 wherein the first sum and the second sum are matched to within 20%.

5. The shadowed current cell of claim 4 wherein the primary current is at least 5 times larger than the shadow current,
wherein a size of the first primary differential transistor is larger than a size of the first shadow differential transistor.

6. The shadowed current cell of claim 5 wherein the true output node connects to a plurality of the shadowed current cell, each shadow current cell receiving a different bit of a digital code as the true input;
wherein the shadowed current cells convert the digital code to an analog current through the true output node, whereby the shadowed current cells form a Digital-to-Analog Converter (DAC).

7. The shadowed current cell of claim 6 wherein the digital code is a thermometer code;
wherein the plurality of shadowed current cells comprise equal-size cells having primary differential transistors with a same first size and having shadow differential transistors having a same second size,
wherein each of the plurality of shadowed current cells contributes and equal impedance to the true output node.

8. The shadowed current cell of claim 6 wherein the first and second primary differential transistors, the first and second shadow differential transistors, the cascode transistor, and the tail transistor are n-channel transistor,
wherein the second supply node is a ground.

9. The shadowed current cell of claim 6 wherein the first and second primary differential transistors, the first and second shadow differential transistors, the cascode transistor, and the tail transistor are p-channel transistor,
wherein the second supply node is a power-supply.

10. An equalized-impedance shadowed current cell comprising:
first primary differential transistor means for conducting a first primary current with a primary ON impedance from a first output to a tail node in response to a first input indicating an ON cell state, and for isolating with a primary OFF impedance when the first input indicates an OFF cell state;
first shadow differential transistor means for conducting a first shadow current with a shadow ON impedance from the first output to the tail node in response to a first inverse input indicating the OFF cell state, and for isolating with a shadow OFF impedance when the first inverse input indicates the ON cell state;
second primary differential transistor means for conducting a second primary current with the primary ON impedance from a second output to the tail node in response to the first inverse input indicating the ON cell state, and for isolating with the primary OFF impedance when the first inverse input indicates the OFF cell state;
second shadow differential transistor means for conducting a second shadow current with the shadow ON impedance from the second output to the tail node in response to the first input indicating the OFF cell state, and for isolating with the shadow OFF impedance when the first input indicates the ON cell state;
a first load coupled between a first supply and the first output;
a second load coupled between the first supply and the second output;
a tail device coupled between the tail node and a second supply.

11. The equalized-impedance shadowed current cell of claim 10 wherein a parallel combination of the primary ON impedance and the shadow OFF impedance has a combined impedance ON cell state value;
wherein a parallel combination of the primary OFF impedance and the shadow ON impedance has a combined impedance OFF cell state value;
wherein the combined impedance ON cell state value is matched to within 10% of the combined impedance OFF cell state value,
whereby cell impedances are matched for the ON cell state and the OFF cell state.

12. The equalized-impedance shadowed current cell of claim 11 wherein the first primary current and the second primary current are each at least 10 times larger than the first shadow current or the second shadow current.

13. The equalized-impedance shadowed current cell of claim 11 wherein the tail device comprises:
cascode transistor means for conducting between the tail node and a cascode node in response to a cascode bias voltage;
tail transistor means for conducting between the cascode node and the second supply in response to a bias voltage.

14. The equalized-impedance shadowed current cell of claim 13 wherein the first primary differential transistor means comprises an n-channel transistor;
wherein the first shadow differential transistor means comprises an n-channel transistor;
wherein the second primary differential transistor means comprises an n-channel transistor;
wherein the second shadow differential transistor means comprises an n-channel transistor;
wherein the second supply comprises a ground.

15. The equalized-impedance shadowed current cell of claim 13 wherein the first primary differential transistor means comprises a p-channel transistor;
wherein the first shadow differential transistor means comprises a p-channel transistor;
wherein the second primary differential transistor means comprises a p-channel transistor;
wherein the second shadow differential transistor means comprises a p-channel transistor;
wherein the second supply comprises a power supply voltage and the first supply comprises a ground.

16. The equalized-impedance shadowed current cell of claim 13 further comprising:
a plurality of the equalized-impedance shadowed current cells, each cell in the plurality of the equalized-impedance shadowed current cells connected to the first output and to the second output, each cell receiving a different bit of a digital code as the first input;
wherein the plurality of the equalized-impedance shadowed current cells convert the digital code to an analog current through the first output,
whereby plurality of the equalized-impedance shadowed current cells form a Digital-to-Analog Converter (DAC).

17. A converter comprising:
a digital input having a plurality of input bits;
a first output line;
a second output line;
a plurality of current cells, each current cell connected to the first output line and connected to the second output line, and receiving an input bit in the plurality of input bits;
each current cell in the plurality of current cells comprising:
a first primary differential transistor having a gate receiving the input bit, with a conducting channel between a tail node and the first output line;
a first shadow differential transistor having a gate receiving a complement of the input bit, with a conducting channel between the tail node and the first output line;
a second primary differential transistor having a gate receiving the complement of the input bit, with a conducting channel between the tail node and the second output line;
a second shadow differential transistor having a gate receiving the input bit, with a conducting channel between the tail node and the second output line;

a first load device coupled between the first output line and a first supply node;

a second load device coupled between the second output line and the first supply node;

a cascode transistor having a channel between the tail node and a cascode node; and a tail transistor having a channel between the cascode node and a second supply node, wherein during an OFF state when the first primary differential transistor is turned off, the first shadow differential transistor conducts a shadow current to the first output line and contributes a shadow ON impedance to the first output line, and the first primary differential transistor contributes a primary OFF impedance to the first output line;

wherein during an ON state when the first primary differential transistor is turned on, the first primary differential transistor conducts a primary current to the first output line and contributes a primary ON impedance to the first output line, and the first shadow differential transistor contributes a shadow OFF impedance to the first output line, whereby the shadow OFF impedance is contributed to the first output line during the ON state, and the shadow ON impedance is contributed to the first output line during the OFF state.

18. The converter of claim 17 wherein an output impedance contributed by a current cell to the first output line during the ON state has a value matched to within 20% of a value of the output impedance contributed by a current cell to the first output line during the OFF state, whereby output impedances are matched for the ON state and for the OFF state.

19. The converter of claim 17 wherein a first sum of a reciprocal of the shadow ON impedance plus a reciprocal of the primary OFF impedance is matched to within 20% to a second sum of a reciprocal of the shadow OFF impedance plus a reciprocal of the primary ON impedance, whereby ON and OFF state impedances are matched in the current cell.

20. The converter of claim 17 wherein each current cell in the plurality of current cells has a same size and generates a same first ON current to the first output line when the input bit to the current cell is in the ON state, and generates a same first OFF current to the first output line when the input bit to the current cell is in the OFF state.

\* \* \* \* \*